(12) United States Patent
Wang et al.

(10) Patent No.: US 12,733,269 B2
(45) Date of Patent: Sep. 8, 2026

(54) TFT OPTICAL SENSOR APPARATUS AND SYSTEM WITH ENHANCED DYNAMIC RANGE

(71) Applicant: Japan Display Inc., Tokyo (JP)

(72) Inventors: Xingle Wang, Tokyo (JP); Chungkai Chen, San Jose, CA (US); Naoki Takada, Tokyo (JP)

(73) Assignee: Japan Display Inc., Tokyo (JP)

( * ) Notice: Subject to any disclaimer, the term of this patent is extended or adjusted under 35 U.S.C. 154(b) by 550 days.

(21) Appl. No.: 18/350,031

(22) Filed: Jul. 11, 2023

(65) Prior Publication Data

US 2025/0022892 A1 Jan. 16, 2025

(51) Int. Cl.
*H10F 39/10* (2025.01)

(52) U.S. Cl.
CPC ......... *H10F 39/103* (2025.01); *H10F 39/107* (2025.01)

(58) Field of Classification Search
None
See application file for complete search history.

(56) References Cited

U.S. PATENT DOCUMENTS

2009/0218476 A1* 9/2009 Kameshima .......... H04N 25/78 250/214 A

* cited by examiner

*Primary Examiner* — Mark T Monk
(74) *Attorney, Agent, or Firm* — XSENSUS LLP

(57) ABSTRACT

An optical sensor system includes a thin-film transistor (TFT) optical panel including an array of TFT pixels, a charge amplifier configured to temporarily store a charge received from a TFT pixel in the array of TFT pixels and generate a voltage based on the temporarily stored charge, an analog-to-digital converter to generate a digitized value based on the voltage, an accumulator configured to store the digitized value, and a controller circuit configured to cause the temporarily stored charge in the charge amplifier to be reset based on one of the voltage and the digitized value.

14 Claims, 12 Drawing Sheets

TFT OPTICAL SENSOR APPARATUS AND SYSTEM WITH ENHANCED DYNAMIC RANGE

FIELD OF THE INVENTION

The present disclosure relates generally to an apparatus and system having an optical sensor, and in particular, a thin-film transistor (TFT) optical sensor with enhanced dynamic range.

BACKGROUND OF INVENTION

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present invention.

Conventional TFT based optical sensor systems include one or more TFT optical panels 100 each including TFT pixels arrayed on a glass substrate. Each TFT pixel on the sensor may collect charge proportional to an amount of incident light, and an analog front end may provide information about the collected charge in each pixel to a host apparatus for use by an application. FIG. 1 shows an example of an optical sensor system including a TFT optical panel 100 including an array of TFT pixels 106, an analog front end 102, and a host 104. The host 104 may be any user of digital raw data and may provide a control function over the TFT optical sensor system. The host 104 may be implemented using discrete or integrated logic circuitry, and/or programmed processing elements including a processor and memory. Control signals provided to the TFT optical panel 100 may include DC voltage supplies having one or more voltage levels (e.g., +/−5 V, 10 V) to accommodate TFT panels that use different voltages than circuits on the silicon AFE. Control signals provided to the TFT optical panel may also include pulsed timing signals used for scanning and excitation of the sensors, and the readout of the sensor signals. The control signals may be provided from the AFE 102 alone, or from AFE 102 and the Host 104, depending on the system architecture.

To achieve high density, measured in pixels per inch (PPI), the number of transistors used in each pixel is advantageously minimized, with common architectures including 1 or 3 transistors per pixel. 1 pixel architecture (i.e., 1-transistor pixel) results in the highest PPI, and generally does not require the provision of additional bias current from an external source. However, a conventional 1-transistor pixel can be noise because of the nature of charge packet transfer and therefore may result in reduced Dynamic Range (DR) and reduced Signal-to-Noise Ratio (SNR) each of which are disadvantageous when sensing low light levels. A conventional 3-transistor pixel architecture is relatively less noisy than the 1-transistor pixel architecture. However, the conventional 3-transistor pixel architecture has a reduced PPI, contains voltage buffer requiring an external bias current source and increased number of interface signals.

FIG. 2 shows a conventional 1-transistor pixel 2100 including only a single TFT transistor 2102, a TFT photo diode 2104 that receives incident light 2108, a capacitance 2106 (which may be discrete or parasitic), output enable signal 2112, control and bias signal line 2110, and data signal line 2114.

FIG. 3 shows a conventional 3-transistor pixel 3100 including three TFT transistors 3102, 3104, and 3106, a TFT photo diode 3108 that receives incident light 3109, a capacitance 3110 (which may be discrete or parasitic), control and bias signal lines 3112, 3114, and 3116, and data signal line 3118. First bias voltage 3120 and second bias voltage 3122 are provided for the transistors 3106 and 3104, respectively. The first bias voltage 3120 and second bias voltage 3122 may have a same value or different values (e.g., 12V, 5V, or 3V).

SUMMARY OF INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

According to one embodiment, an optical sensor system includes a thin-film transistor (TFT) optical panel including an array of TFT pixels; a charge amplifier configured to temporarily store a charge received from a TFT pixel in the array of TFT pixels and generate a voltage based on the temporarily stored charge; an analog-to-digital converter to generate a digitized value based on the voltage; an accumulator configured to store the digitized value; and a controller circuit configured to cause the temporarily stored charge in the charge amplifier to be reset based on one of the voltage and the digitized value.

Each TFT pixel of the embodiment may include only one TFT.

The charge amplifier of the embodiment may include an operational amplifier, and a reset transistor having a first controlled terminal connected to an inverting input of the operational amplifier, a second controlled terminal connected to an output of the operational amplifier, and a reset control terminal that controls current flow in the first controlled terminal and the second controlled terminal. The controller circuit may send a reset signal pulse to the reset control terminal to cause the temporarily stored charge in the charge amplifier to be reset.

The controller circuit of the embodiment may include a first controller circuit and a second controller circuit. The second controller circuit may include a comparator that compares an output of the charge amplifier to a predetermined threshold value, a D-flip flop having a clock input connected to the output of the comparator, and a D-input connected to a logic 1 value, an exclusive-OR gate having a first input connected to a non-inverting output of the D-flip flop, and a programmable delay circuit having an input connected to the non-inverting output of the D-flip flop. A second input of the exclusive-OR gate may be connected to an output of the programmable delay circuit, and an output of the exclusive-OR gate may output an extended read reset signal pulse to the first controller circuit. The first controller circuit may send a reset signal to the charge amplifier based on the extended read reset signal pulse to cause the temporarily stored charge in the charge amplifier to be reset.

The controller circuit of the embodiment may include a first controller circuit and a second controller circuit. The second controller circuit including a programmed processor configured to determine when an output of the charge amplifier exceeds a predetermined threshold value and, after a predetermined delay time, output an extended read reset signal pulse to the first controller circuit. The first controller circuit may send a reset signal to the charge amplifier based on the extended read reset signal pulse to cause the temporarily stored charge in the charge amplifier to be reset.

The embodiment may also include a host apparatus including a host processer circuit configured to operate according to a host application that uses information obtained from the TFT pixels. The accumulator includes an n+m bit adder circuit having an n bit input and an n+m bit input and configured to add a value of the n bit input to a value of the n+m bit input, the n-bit input being connected to an output of the analog-to-digital converter, and an n+m bit register circuit having a D input connected to an output of the n+m bit adder circuit, and a non-inverting output connected to the n+m bit input of the n+m bit adder circuit, an output of the n+m bit register circuit being provided to the host application.

In the embodiment, a read cycle may correspond to the time during which the charge is received from a same TFT pixel in the array of TFT pixels. Each read cycle includes a plurality of sub-read cycles. The temporarily stored charge in the charge amplifier may be reset at the end of each sub-read cycle. The accumulator may accumulate the digitized value of each temporarily stored charge prior to the reset at the end of each sub-read cycle so that at the end of the read cycle, the accumulator stores a digitized value that is a sum of the digitized values of each of the temporarily stored charges in each sub-read cycle of the read cycle.

Another embodiment is a method of operating an optical sensor system, the method including receiving light on a thin-film transistor (TFT) optical panel including an array of TFT pixels; temporarily storing, in a charge amplifier, a charge received from a TFT pixel in the array of TFT pixels; generating a voltage based on the temporarily stored charge; generating, in an analog-to-digital converter, a digitized value based on the voltage; storing the digitized value in an accumulator; and causing, by a controller circuit, the temporarily stored charge in the charge amplifier to be reset based on one of the voltage and the digitized value.

The method may include sending, from the controller circuit, a reset signal to cause the temporarily stored charge in the charge amplifier to be reset, when the voltage exceeds a predetermined threshold.

The method may include sending, from the controller circuit, a reset signal to cause the temporarily stored charge in the charge amplifier to be reset, when the digitized value based on the voltage exceeds a predetermined threshold.

The method may include accumulating, in the accumulator, a sum of the digitized value and a previously accumulated digitized value, each time the voltage exceeds a predetermined threshold.

The method may include accumulating, in the accumulator, a sum of the digitized value and a previously accumulated digitized value, each time the digitized value exceeds a predetermined threshold.

In the method, a read cycle may correspond to the time during which the charge is received from a same TFT pixel in the array of TFT pixels, each read cycle includes a plurality of sub-read cycles, and the temporarily stored charge in the charge amplifier is reset at the end of each sub-read cycle, and the accumulator may accumulate the digitized value of each temporarily stored charge prior to the reset at the end of each sub-read cycle so that at the end of the read cycle, the accumulator stores a digitized value that is a sum of the digitized values of each of the temporarily stored charges in each sub-read cycle of the read cycle.

A further embodiment is a non-tangible computer readable medium storing instructions, which when executed by a computer in an optical sensor system including a thin-film transistor (TFT) optical panel including an array of TFT pixels, a charge amplifier configured to temporarily store a charge received from a TFT pixel in the array of TFT pixels and generate a voltage based on the temporarily stored charge, and an analog-to-digital converter to generate a digitized value based on the voltage, cause the computer to perform steps including storing the digitized value in an accumulator; and causing the temporarily stored charge in the charge amplifier to be reset based on one of the voltage and the digitized value.

The computer may be caused to send a reset signal to cause the temporarily stored charge in the charge amplifier to be reset when the voltage exceeds a predetermined threshold.

The computer may be caused to send a reset signal to cause the temporarily stored charge in the charge amplifier to be reset when the digitized value based on the voltage exceeds a predetermined threshold.

The computer may cause the accumulator to accumulate a sum of the digitized value and a previously accumulated digitized value, each time the voltage exceeds a predetermined threshold.

The computer may cause the accumulator to accumulate a sum of the digitized value and a previously accumulated digitized value, each time the digitized value exceeds a predetermined threshold.

According to the non-tangible computer readable medium embodiment, a read cycle may correspond to the time during which the charge is received from a same TFT pixel in the array of TFT pixels, each read cycle includes a plurality of sub-read cycles, and the temporarily stored charge in the charge amplifier is reset at the end of each sub-read cycle, and the accumulator may accumulate the digitized value of each temporarily stored charge prior to the reset at the end of each sub-read cycle so that at the end of the read cycle, the accumulator stores a digitized value that is a sum of the digitized values of each of the temporarily stored charges in each sub-read cycle of the read cycle.

BRIEF DESCRIPTION OF THE DRAWINGS

The scope of the present disclosure is best understood from the following detailed description of exemplary embodiments when read in conjunction with the accompanying drawings, wherein.

Further areas of applicability of the present disclosure will become apparent from the detailed description provided hereinafter. It should be understood that the detailed description of exemplary embodiments is intended for illustration purposes only and are, therefore, not intended to necessarily limit the scope of the disclosure.

DETAILED DESCRIPTION

Figure 1:
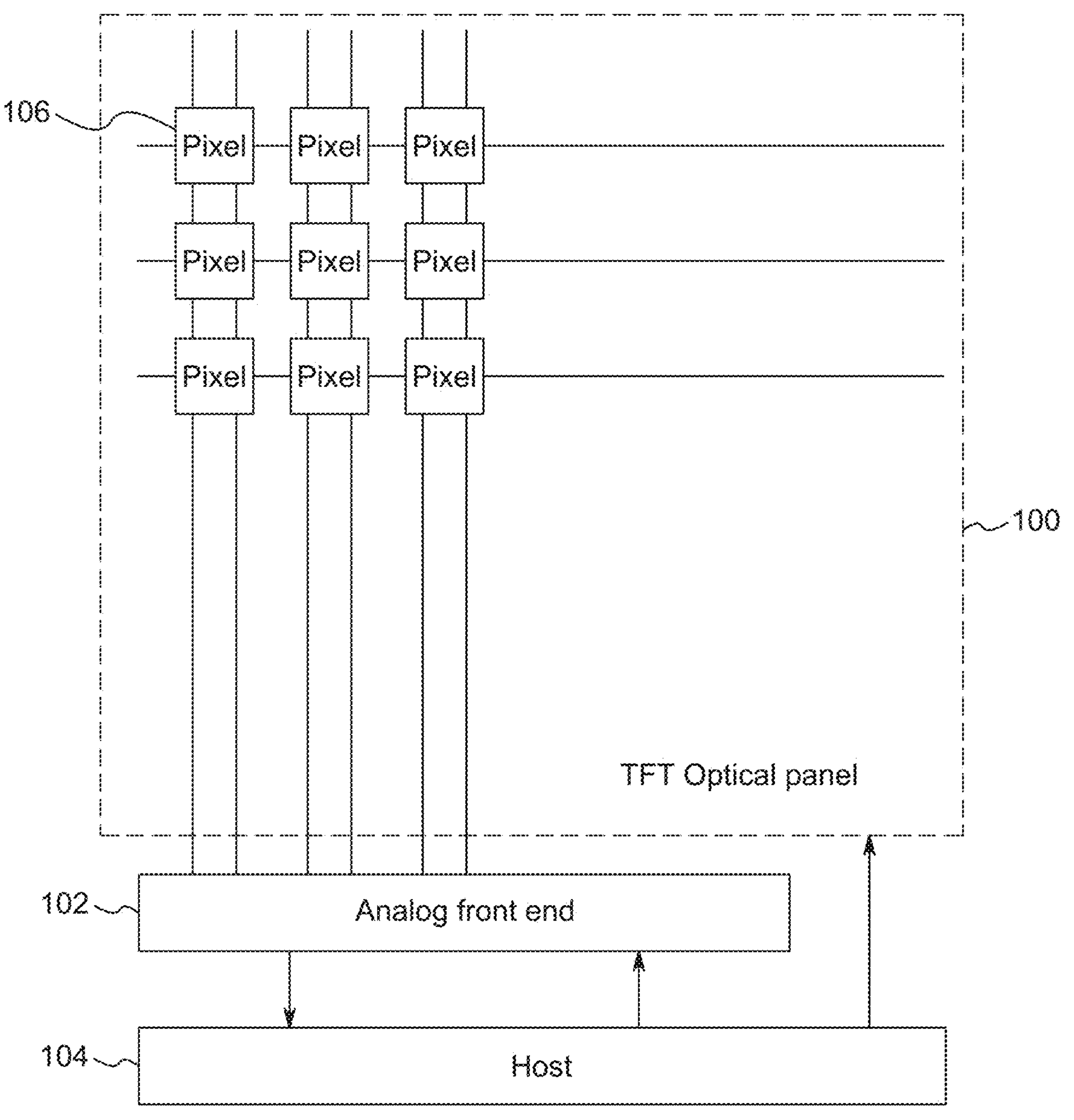
FIG. 1 is a block diagram of an optical sensor system.
Figure 2:
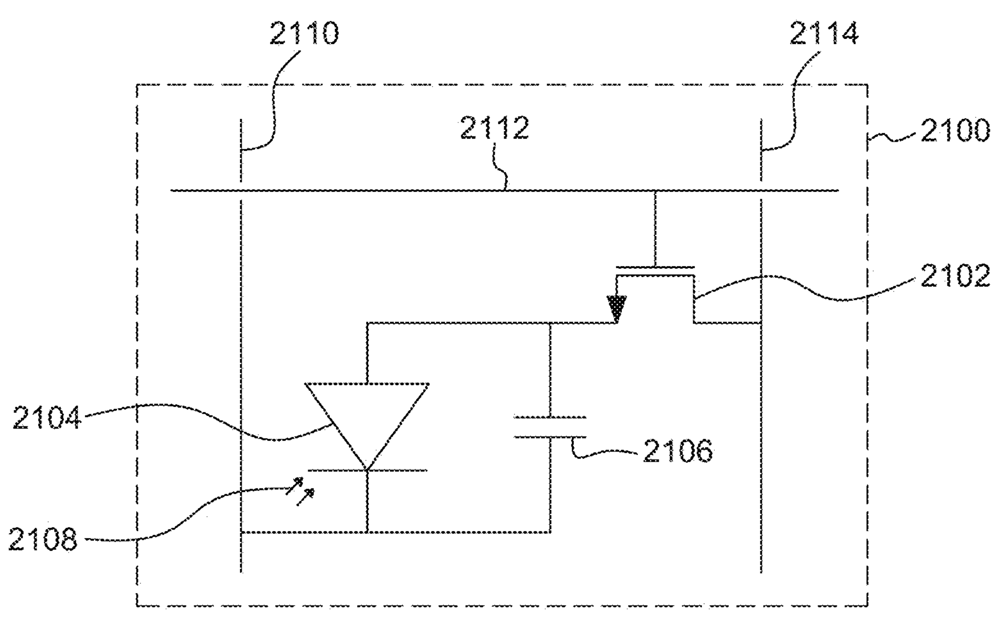
FIG. 2 is a schematic of a 1-transistor pixel.
Figure 3:
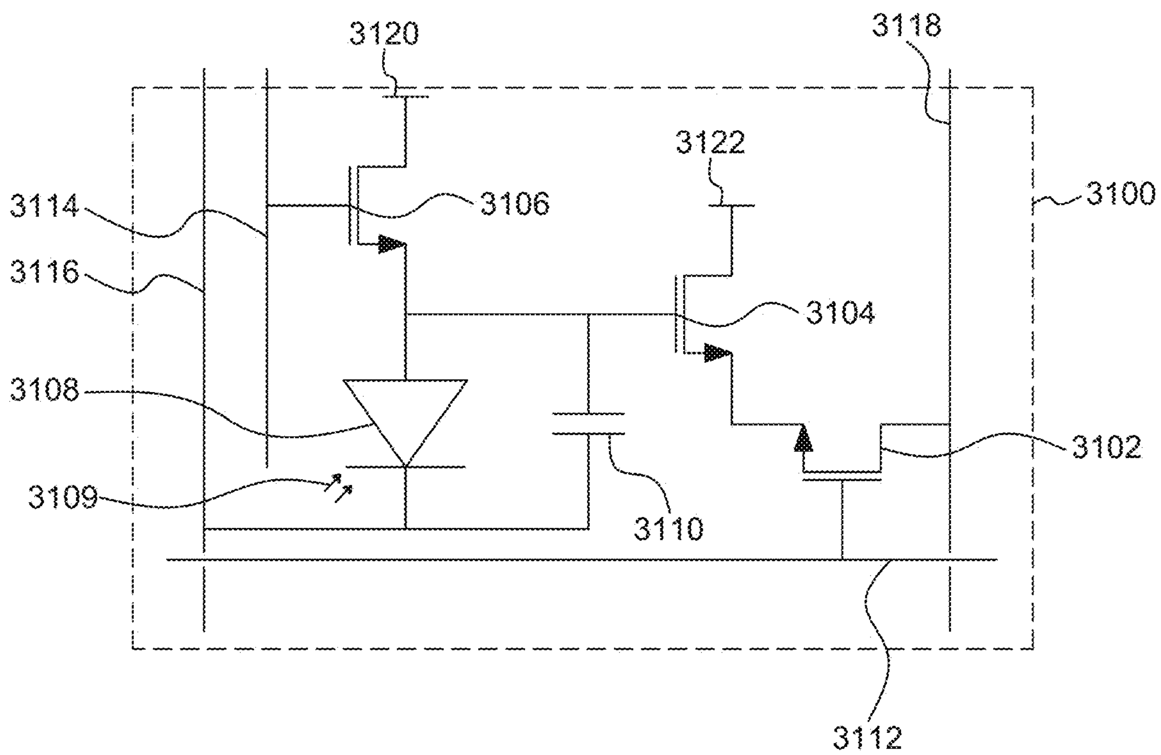
FIG. 3 is a schematic of a 3-transistor pixel.
Figure 4:
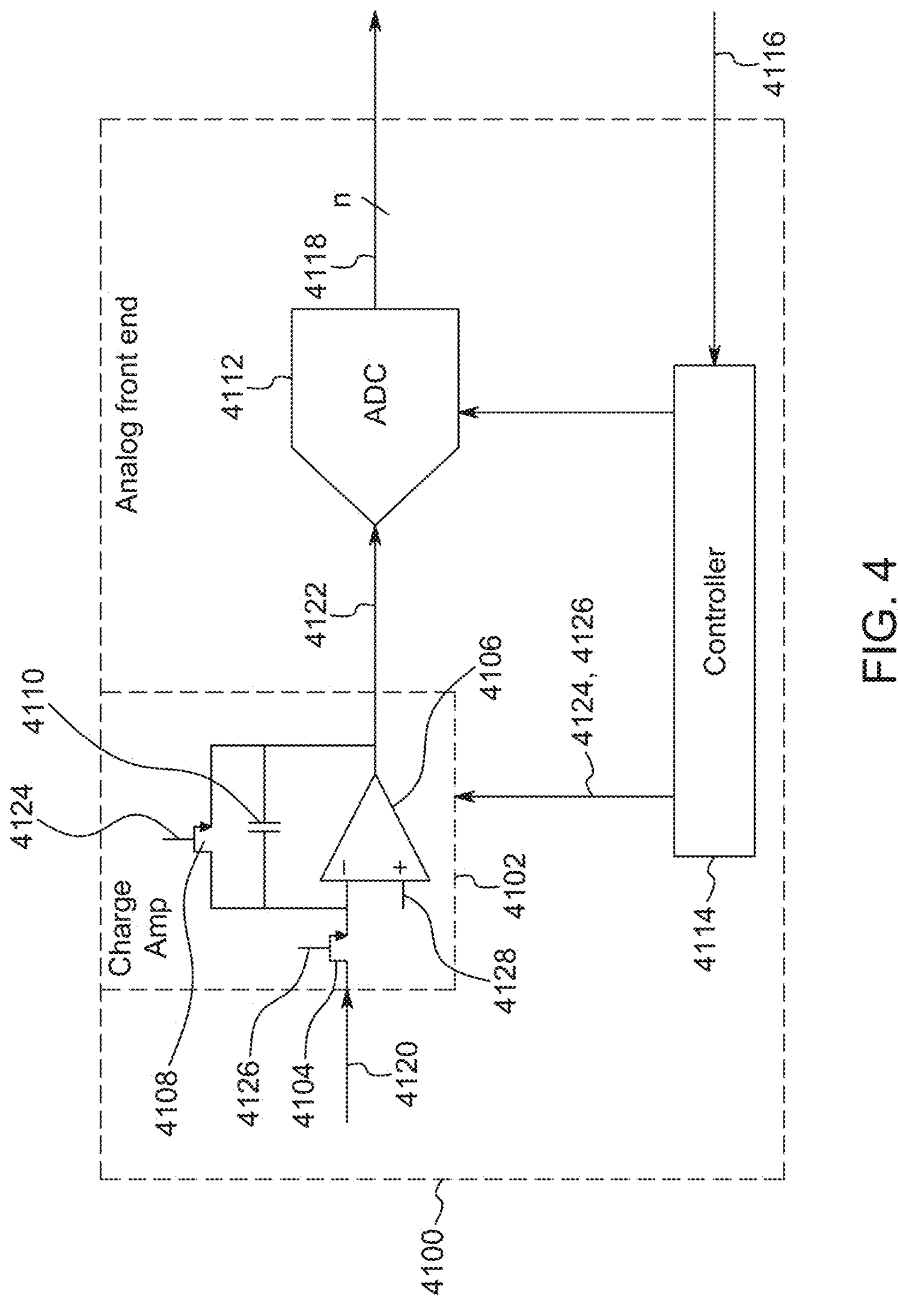
FIG. 4 is a schematic of an analog front end used in an optical sensor system.

FIG. 4 shows an analog front end 4100 including a charge amplifier 4102, a controller 4114, and an analog-to-digital converter (ADC) 4112. The charge amplifier 4102 receives a charge signal 4120 indicating a charge stored in the capacitor of a pixel in a connected TFT optical panel and produces a corresponding voltage signal 4122. The voltage signal 4122 is converted into an n-bit digital signal ADC output 4118 by the ADC 4112 and provided to a connected host. Operation of the charge amp 4102 and the ADC 4112 are coordinated by the controller 4114, which is in turn controlled by pixel read signal line 4116 from the host. Pixel read signal line 4116 starts the read cycle. The charge amp 4102 includes an input transistor 4104 and an operational amplifier 4106 with an inverting feedback loop including parallel connected reset transistor 4108 and integrating capacitor 4110. A drain of the input transistor 4104 is connected to the charge signal 4120, a source of the input transistor 4104 is connected to the inverting input of the operational amplifier 4106, and a gate of the input transistor 4104 is controlled by input control signal 4126 from the controller 4114. A drain of the reset transistor 4108 is connected to the inverting input of the operational amplifier 4106, a source of the reset transistor 4108 is connected to an output of the operational amplifier 4106, and a gate of the reset transistor 4108 is controlled by reset control signal 4124 from the controller 4114. The non-inverting input of the operational amplifier 4106 is connected to a fixed reference voltage 4128. Input transistor 4104 performs a multiplexing function—the input charge signal 4120 can get to the inverting input node of the op-amp 4106 only if the control signal 4126 is ON. Reset transistor 4108 performs a reset function on the output voltage 4122 of the op-amp 4106 when reset control signal 4124 is active/high. In particular, when performing a reset function, input transistor 4104 is set to OFF; then reset control signal 4124 goes active/high turning reset transistor 4108 ON, resetting the op-amp. As a result, the output voltage signal 4122 of the op-amp 4106 is equalized with the inverting input node of the op-amp, which is always set to reference voltage 4128. Thus, both nodes become set to the reference voltage 4128. Subsequently, during light collecting operation reset control signal 4124 goes inactive/low turning reset transistor 4108 OFF and input transistor 4104 is turned ON allowing charge to flow from a connected pixel to the inverting node of the op-amp 4106, where the charge is stored on the integrating capacitor 4110. The charge stored in the integrating capacitor 4110, divided by the capacitance value of the integrating capacitor 4110 becomes the op-amp output voltage signal 4122. Controller 4114 also provides one or more control signals to the ADC 4112.

Figure 5:
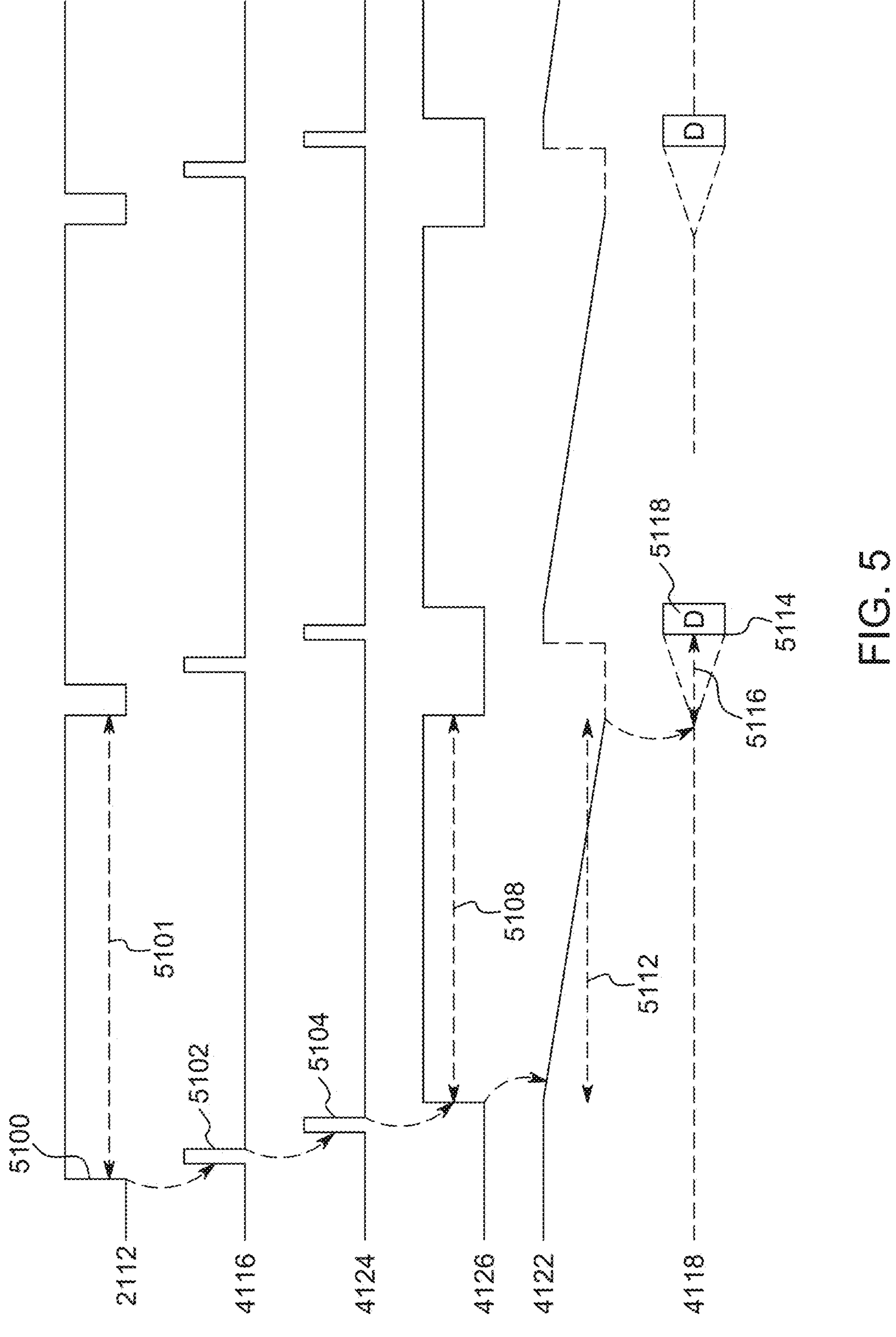
FIG. 5 is a timing diagram illustrating operation of the analog front end in FIG. 4.

FIG. 5 shows a timing diagram of an example of the operation of analog front end 4100 in FIG. 4 with a 1-transistor pixel 2100. On a rising edge 5100 of the output enable signal 2112 generated by the host, the host sends a command pulse 5102 to the controller 4114 through pixel read signal line 4116. After receiving command pulse 5102, the controller 4114 issues a signal pulse 5104 of a reset signal 4124 to the gate of the reset transistor 4108. The integration time control signal 4126 is maintained active high for a duration 5108. A falling edge of the feedback control signal 4124 triggers a rising edge on the integration time control signal 4126. While the integration time control signal 4126 is active high, charge is transferred from a corresponding pixel in the optical panel to the analog front end, and operational amplifier 4106 produces corresponding voltage signal 4122. A duration of time for which the analog front end remains connected to the pixel is 5108. A duration of time for which the charge is integrated at the analog front end is charge amplifier integration time 5112. At the end of integration time 5112, the ADC 4112 converts the voltage signal 4122 to a digital value ADC output 5118, with conversion time 5116, and outputs digital data 5118 to the host via n-bit signal bus ADC output 4118. Time point 5114 is the time when ADC output 5118 becomes valid and available.

Figure 6:
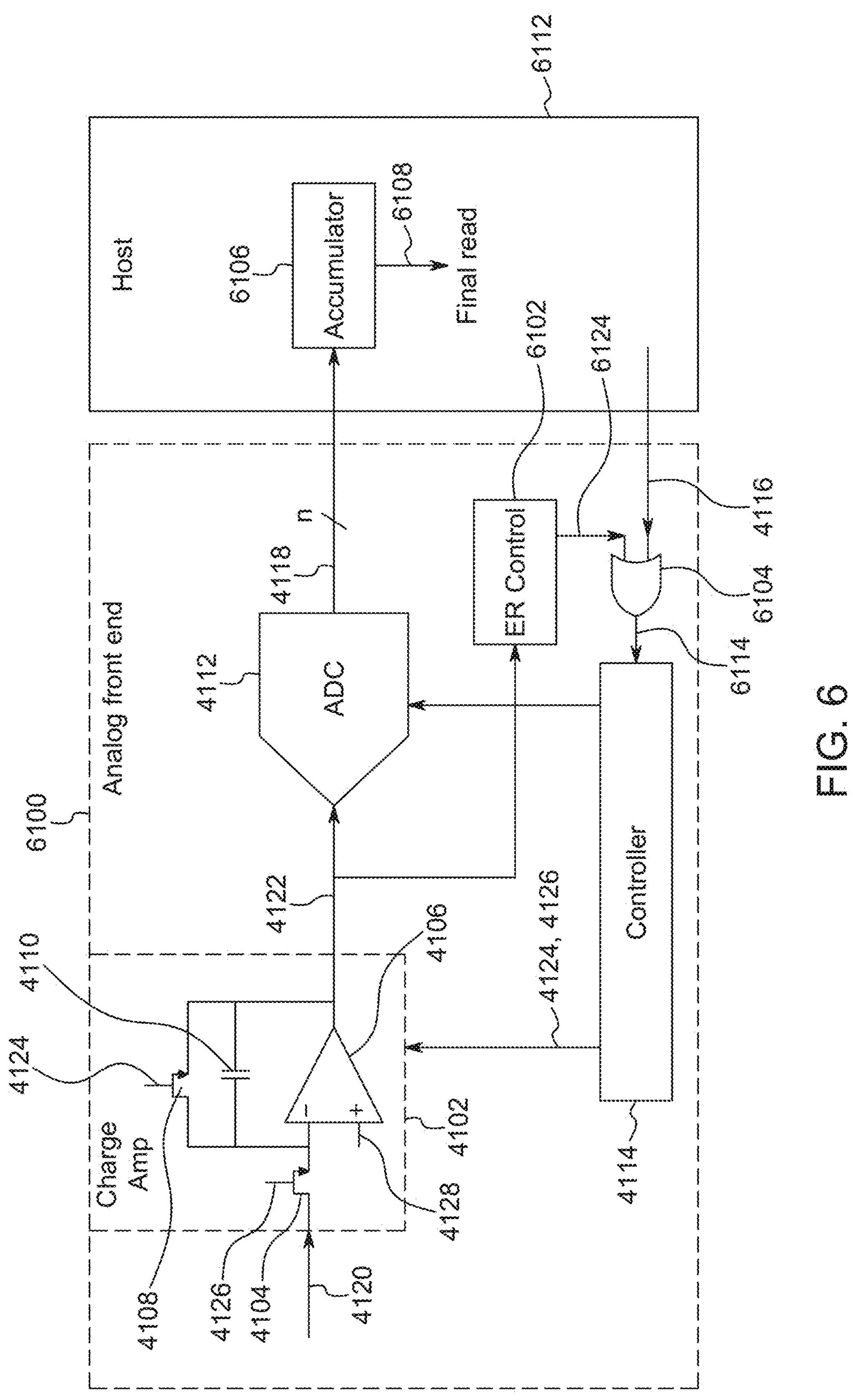
FIG. 6 is a block diagram of an analog front end and a host according to a first embodiment of the invention.

FIG. 6 shows a block diagram of an analog front end 6100 and host 6112 according to a first embodiment of the present invention. The analog front end 6100 includes an extended read (ER) controller 6102 and OR gate 6104 which combine to form a second control circuit to provide an extended pixel read signal 6114 to the controller 4114 (a first control circuit) based on the voltage signal 4122 and a host read command 6110 from the host 6112. In the host 6112, an accumulator section 6106 receives one or more digital signals ADC output 4118 and combines or accumulates those to form a combined final read signal 6108.

According to the first embodiment, the ER controller 6102 and OR gate 6104 are implemented within the analog front end 6100. The charge amplifier output voltage 6122 is monitored against a predetermined threshold value 8112 (see FIG. 8), and each time the threshold is reached, the ER controller 6102 issues a read command which is multiplexed (using an OR gate 6104) with the host read command 6110. Thus, enhanced dynamic range (EDR) may be implemented by adding ER controller 6102 and OR gate 6104 before a conventional controller within an analog front end 4114, allowing the controller 4114 to be controlled by the ER controller 6102 and OR gate 6104 instead of only by the host 6112. This way, the embodiment allows for great modularity and design reuse, as compared with the conventional approach.

Dynamic Range (DR) of a sensor apparatus may be considered as Maximum Signal, $S_{max}$, divided by the Minimum Signal, $S_{min}$. That is, $DR=S_{max}/S_{min}$. Here signal S can be measured in power or voltage. DR may be expressed in dB, i.e., $DR_{dB}=10*\log(S_{max}/S_{min})$, if S is measured in power; or $DR_{dB}=20*\log(S_{max}/S_{min})$, if S is measured in voltage. $S_{max}$ is the maximum signal value the elements of the apparatus can handle. $S_{max}$ may be limited by the sensor/pixel panel, or the readout system including the Charge Amplifier of the AFE. $S_{min}$ is the minimum signal the system can handle, and may similarly be limited by the sensor/pixel panel or the capability of AFE. Usually the system noise (either the panel noise or AFE noise) determines $S_{min}$. We may assume that $S_{min}$ is relatively stable. Therefore, an embodiment of the invention may achieve Extended DR (EDR) by extending the value of $S_{max}$. In particular, to extend $S_{max}$, an embodiment of the invention may increase the effective duration of time for which light is collected, without causing saturation of signals due to the limits of the sensor/pixel or the AFE.

Figure 7:
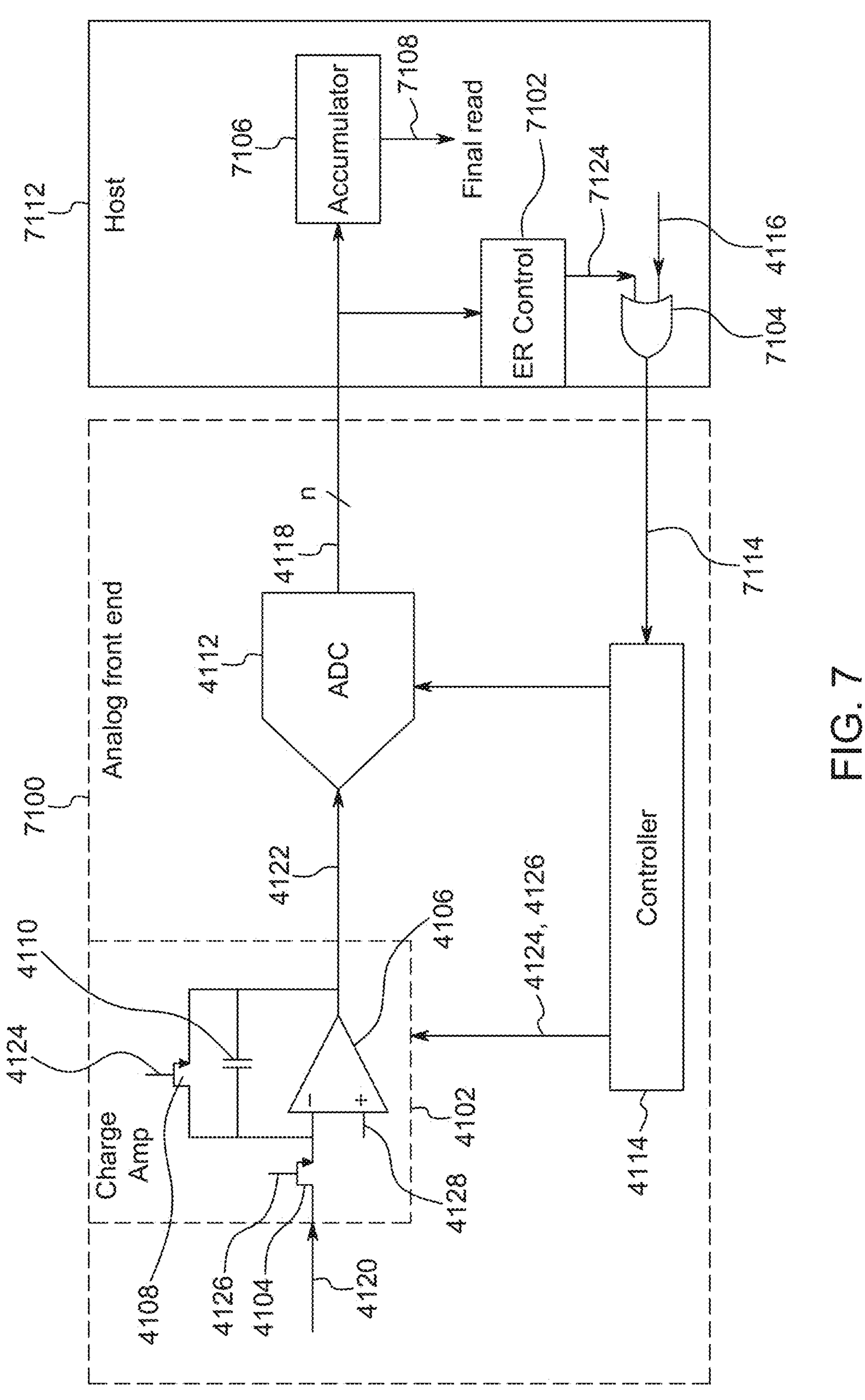
FIG. 7 is a block diagram of an analog front end and a host according to a second embodiment of the invention.

FIG. 7 shows a block diagram of an analog front end 7100 and host 7112 according to a second embodiment of the present invention. The host 7112 includes an extended read control section 7102 and OR gate 7104 which combine to form a second controller circuit to provide an extended pixel read signal 7114 to the controller 4114 (a first controller circuit) based on digital signals ADC output 4118. An accumulator section 7106 in the host 7112 receives one or more digital signals ADC output 4118 and combines or accumulates those to form a combined final read signal 7108.

According to the second embodiment, the extended read control section 7102 and OR gate 7104 are implemented within the host 7112. The ADC 4112 outputs ADC output 4118, which is monitored in the host against a predetermined threshold value 8112, and each time the threshold is reached, the extended read control section 7102 issues a read command which is multiplexed with the original read command 7110 issued by the host 7112.

The second embodiment results in fewer changes to the conventional analog front end than the first embodiment, allowing for greater reuse and modularity than the first embodiment. The first embodiment has a smaller/faster decision loop than the second embodiment, which may allow for more efficient or rapid operation. By implementing the extended read control section 7102 and OR gate 7104 functionality in the host, according to the second embodiment, the inventive features can be implemented at a higher level, for example, using logic and/or software, with the attendant advantages and disadvantages that software brings (e.g., advantage: greater modularity and case of modification for particular requirements; disadvantages: greater latency in determining reset timing). In the first embodiment, the decision loop may be smaller/faster, which may require additional circuitry for the AFE, which may be avoided in the second embodiment. The second embodiment may advantageously be used more readily with existing AFE designs.

Figure 8:
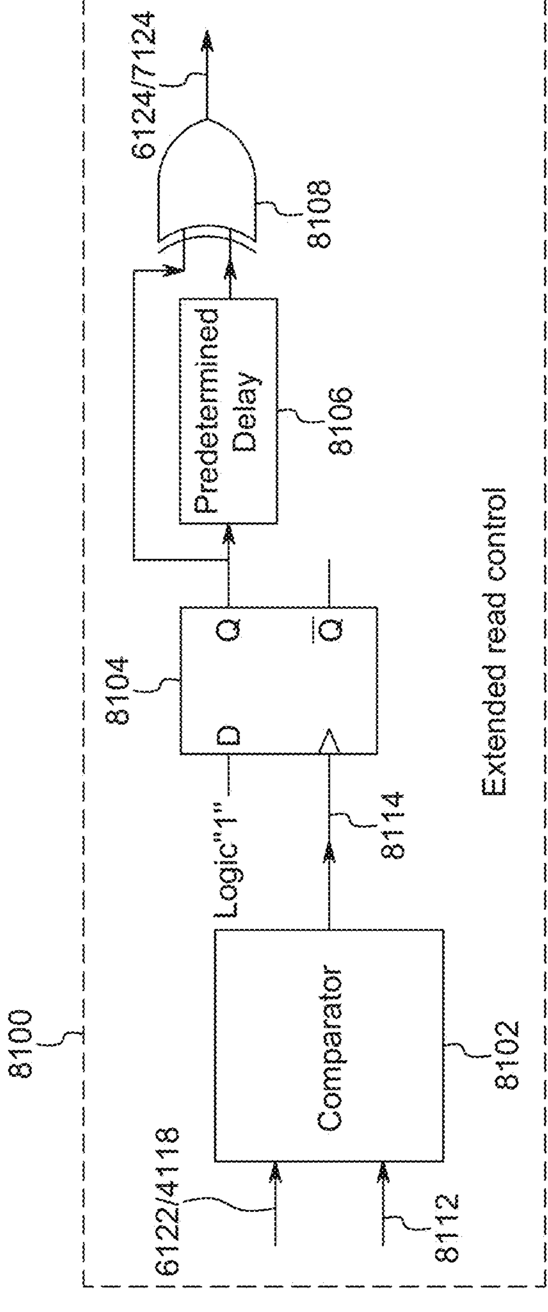
FIG. 8 is a block diagram of an extended read control logic according to an embodiment of the invention.

FIG. 8 is an example of an implementation of the extended read control logic 8100 used in either of the first and second embodiments (as ER controllers 6102 and 7102, respectively). The extended read control logic 8100 includes a comparator 8102, which may be implemented as an analog comparator circuit in the first embodiment or as a digital comparator function in the second embodiment. When used in the first embodiment, the comparator 8102 compares the voltage signal from the charge amplifier 6122 (received as signal 8110) with a predetermined threshold value 8112. When used in the second embodiment, the comparator compares a digital signal ADC output 4118 (received as signal 8110) with a predetermined threshold value 8112. In either case, the output of the comparison generates a rising edge to a D-flip flop 8104, on the clock input 8114. The D input of the D-flip flop 8104 is set to one at this moment, and the output of the D-flip flop 8104 is provided to a predetermined delay 8106 and a first input of an exclusive-OR gate 8108. An output of the predetermined delay 8106 is provided to a second input of the exclusive-OR gate 8108. An output 6124/7124 of the exclusive-OR gate 8108 is combined with a pixel read signal 4116 from the host to produce the extended pixel read signal 6114/7114. The output of exclusive-OR gate 8108 is a pulse having width controlled by the predetermined delay 8106; the pulse appears as 1002 and 1004 as in FIG. 10. The predetermined delay 8106 controls a pulse width of the pulses generated by the controller to have a predetermined length, including pulses 1000, 1002, and 1004 to allow for proper operation of the digital logic (so that the receiving circuits can properly receive and recognize the pulses).

Figure 9:
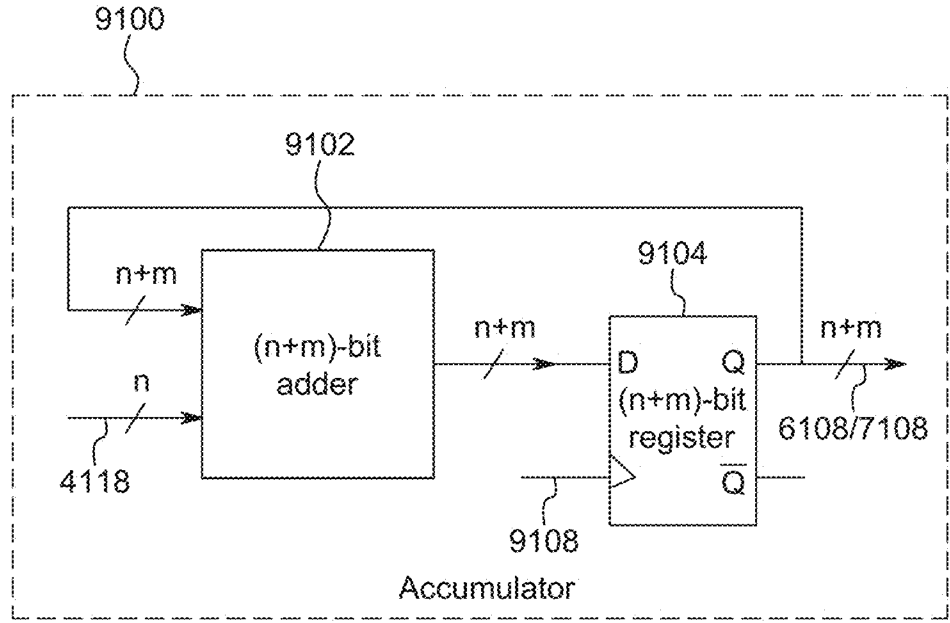
FIG. 9 is a block diagram of an accumulator according to an embodiment of the invention.

FIG. 9 is an example of an implementation of an accumulator 9100 which may be used in the first or second embodiment (as 6106 or 7106, respectively). The accumulator 9100 includes an (n+m)-bit adder 9102 that receives the n-bit output of the ADC as signal 9106. The (n+m)-bit adder 9102 adds that received value to a previously accumulated value output from the (n+m) bit register 9104. Upon receipt of clock signal 9108, the newly accumulated value from the (n+m)-bit adder 9102 is stored in the (n+m) bit register 9104. The value stored in the (n+m) bit register 9104 is output as signal 9110, the final output value. Clock signal 9108 is the only clock signal in the accumulator implementation. The clock signal 9108 is controlled by the Host 6112/7112, or a logic unit within the Host. At each edge of clock signal 9108, register 9104 will update its content. As long as clock signal 9108 is not too fast (frequency being too high), 9104 will be able to update its content reliably. Hence there is no strict timing requirement on clock signal 9108, as long as the Host knows when to poll for the final read output data 6108/7108.

Each additional bit in the m bits of n+m output bits represents an additional 6 dB of Dynamic Range augmentation (i.e., each added bit doubles—a factor of 2—the range, e.g., 20*log(2)=6 dB). For example, m=4 would be able to accommodate an addition of 24 dB of Dynamic Range. Thus, m=5 has 6 dB more dynamic range than m=4. "n+m" bits would accommodate m*6 dB more dynamic range than "n" bits.

Figure 10:
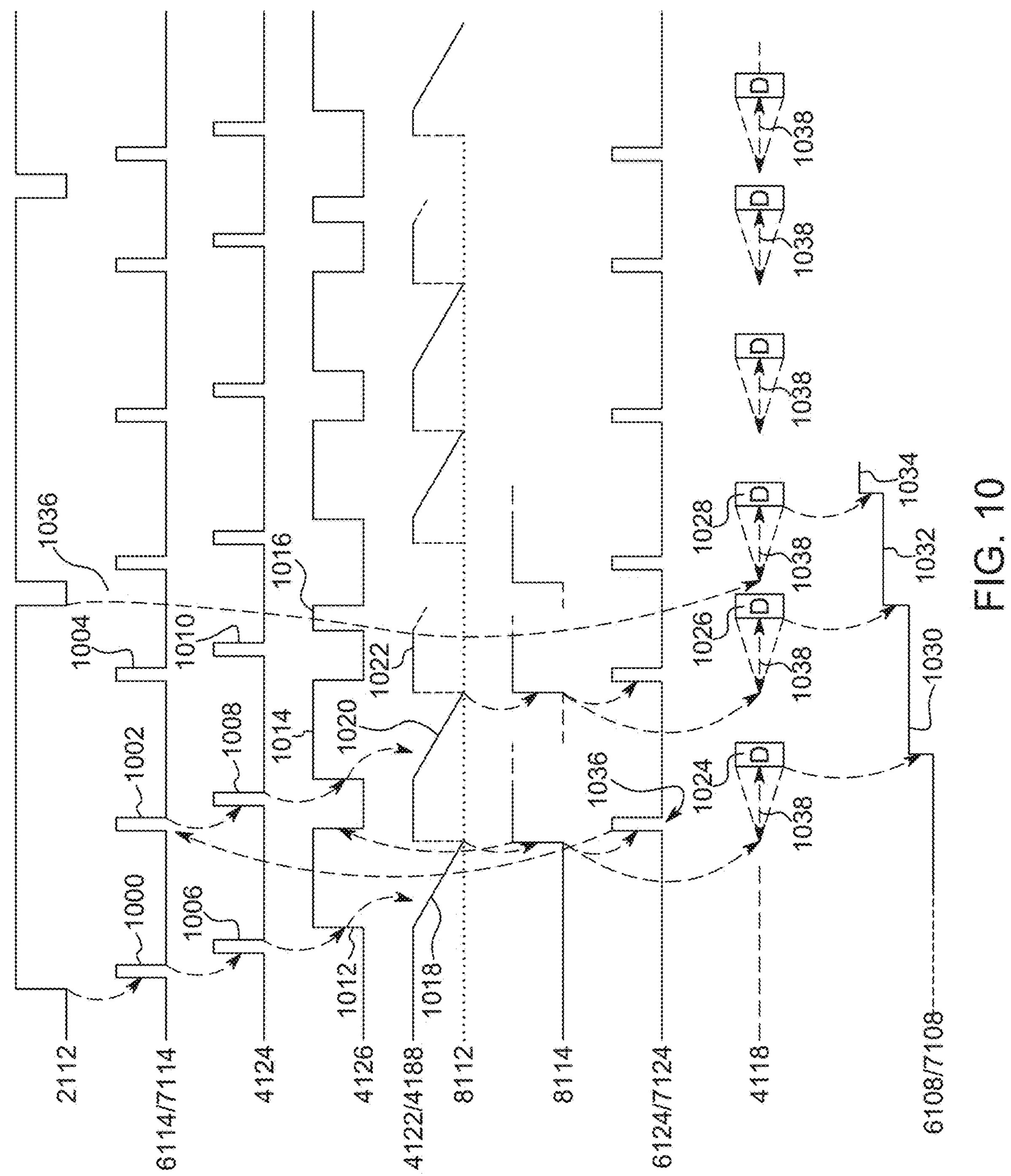
FIG. 10 is a timing diagram illustrating operation of an embodiment of the invention.

FIG. 10 shows a timing diagram illustrating operation of the first or second embodiment of the invention with a 1-transistor pixel 2100. On a rising edge of the output enable signal 2112 generated by the host, a first line read pulse 1000 is generated on the pixel read line 4116. In the embodiment of FIG. 6, the pixel read signal line 4116 is combined with ER control output 6124 by an OR-gate 6104 to create extended pixel read signal 6114 provided to the controller 4114. In the embodiment of FIG. 7, the pixel read signal line 4116 is combined with ER control output 7124 by OR-gate 7104 to create a new input extended pixel read signal 7114 to the controller 4114. In each case, the controller 4114 may retain the design of a controller 4114 as in FIG. 4, but is operated according to the new inputs extended pixel read signal 6114 or extended pixel read signal 7114 to achieve the benefits of enhanced dynamic range. In the ER controller 6102 or ER controller 7102, the comparator 8102 comparison output 8114. A rising edge on comparison output 8114 corresponds to a situation in which the charge amplifier output 4122 or ADC output 4118 exceeds a predetermined threshold value 8112.

At this time, to prevent saturation and loss of information, the embodiments of the invention store the current temporary charge from the charge amplifier (in the embodiment of FIG. 6) or stores the current digitized value of the temporary stored charge from the charge amplifier (in the embodiment of FIG. 7) and resets the charge amplifier so that additional charge from the same corresponding TFT pixel may be received. Thus, on a rising edge of the comparison output 8114 and using the output of the XOR gate 8108, a logic 1 value is clocked into the D-flip flop 8104, and a rising edge of the ER control output pulse 6124/7124 is generated. Then, after the predetermined delay 8106, a falling edge of the ER control output pulse 6124/7124 is generated. Thus, a width of the ER control output pulse 6124/7124 is time 1036. The ER control output pulse 6124/7124 becomes the extended pixel read signal 6114/7114 by OR gate 6104/7104. The rising edge of the comparison output 8114 also triggers an ADC conversion cycle, which is indicated on ADC output 4118.

A falling edge of the line read pulse 1000 triggers a charge amplifier reset pulse 1006 on the feedback control signal 4124. A falling edge of the feedback control signal 4124 triggers a rising edge on the integration time control signal 4126. While the integration time control signal 4126 is active high, charge is transferred from a corresponding pixel in the optical panel to the analog front end, and operational amplifier 4106 produces corresponding voltage signal 4122.

As discussed above, when the extended read controller determines that the voltage output 4122 (in the first embodiment) or the digital signal ADC output 4118 crosses the predetermined threshold value 8112, the controller causes the corresponding value of the digital signal ADC output 4118 to be stored in the accumulator. As further illustrated in FIG. 10 at lines 4118 and 6108/7108, when ADC output 4118 becomes valid at the start of each time period 1024, 1026, and 1028, it can be latched into the accumulator. For example, in a completely synchronous manner, the host may control when the ADC output 4118 becomes valid—e.g., after a certain, pre-determined conversion time 1038 elapses, the host knows that ADC output is stable and valid, at which time the host can move the ADC data into the accumulator by asserting signal 9108 in FIG. 9. Alternatively, an asynchronous (i.e., event based) control logic can determine when the ADC data is available to be read after conversion time 1038.

The accumulated value stored in the accumulator 6106/7106 is thereby incremented to the value shown by level 1030. Reaching the predetermined threshold value 8112 also triggers the start of a reset and a new read cycle. Each read composes of (roughly) 3 steps: 1) integration, 2) ADC conversion, and 3) accumulator latching in the read value. Therefore, each read requires step 1) and 2) start from the same, pre-defined state (hence called "reset" after last read), and step 3) maintain the value gained from the last read. After each (one sub-read cycle) within the same (OE enable time frame), the accumulator is updated to store a value corresponding to the charge collected within each (sub-read cycle).

Thus, according to embodiments of the invention, each read operation, during which charge from a single TFT pixel in the TFT pixel array is received, is divided into a plurality of sub-read cycles. The temporarily stored charge in the charge amplifier during each sub-cycle is digitized and accumulated in the accumulator. Then, at the end of each sub-cycle, the charge amplifier is reset. Thus, at the end of the last sub-cycle in the read cycle, the accumulator stores a sum of the digitized values corresponding to the charge received in each sub-cycle.

As shown in FIG. 10, digitized values for sub-cycles are valid during the time periods 1024, 1026, and 1028. The sub-read cycle digitized value 1024 causes the accumulated digitized value 6108/7108 to increase to level 1030, the addition/accumulation of sub-read cycle digitized value at time 1026 causes the accumulated digitized value 6108/7108 to increase to level 1032, and the addition/accumulation of sub-read cycle digitized value at time 1028 causes the accumulated digitized value 6108/7108 to increase to level 1034. In this example, since the sub-read cycle corresponding to accumulated digitized value at time 1028 is the last sub-read cycle in the corresponding read cycle, the accumulated level 1034 becomes the final read value 6108/7108.

Sub-read cycles may be performed continuously until a predetermined OE duration (i.e., read time) expires. The OE duration may be the same or different than a conventional OE duration. Alternatively, a sub-read control algorithm in the host or the ER controller 6102/7102 may establish a predetermined number of sub-reads per read cycle, or a different number of sub-reads for each particular read cycle, and the sub-reads may then continue until the predetermined number of sub-reads have completed.

Thus, embodiments of the invention may advantageously collect more charge information from a 1-transistor pixel over a longer period of time, without saturation; or, from a 1-transistor pixel under a high input level, without saturation. Also, for a moderate input level, embodiments according to the present invention may enable virtually infinite read time without AFE going saturation, dependent only on accumulator memory depth. In addition, for a high input level, embodiments according to the present invention may enable multiple reads within each OE, in a given OE time, so that more charges are collected and converted, without AFE going into saturation.

Figure 11:
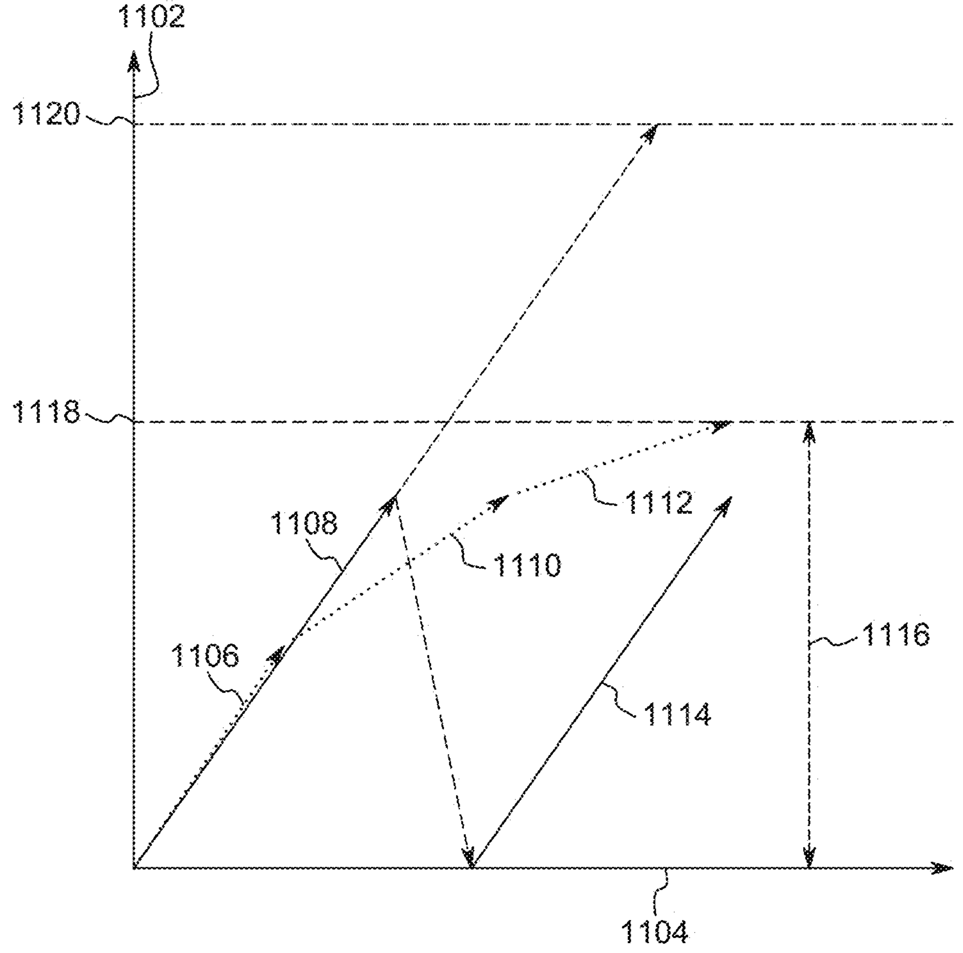
FIG. 11 illustrates an example of linear and non-linear response of charge amplifier output vs. integration time.

FIG. 11 illustrates a linear and non-linear response of charge amplifier output 1102 vs. integration time 1104, in regard to an amount of captured light during a period of time. Another problem with conventional designs is that they may not show linear response, which complicates the interpretation of the received signal. However, according to an embodiment of the invention, the system response is linear (i.e., constant amount of light captured during unit period of time). For example, during an initial portion of integration time 1106, in most systems, the response is linear (i.e., relatively constant increase in output over time). As the amount of captured light increases and the output of charge amplifier output 1102 approaches the well compacity of the pixel and/or charge amplifier capacity 1118 (aka, $S_{max}$), the response in a conventional system become progressively less linear at time 1110 and 1112 to delay the effects of saturation. Thus, in the conventional design, that delay results in non-linear response. However, according to an embodiment of the invention, additional light can be received by appropriately resetting the charge pump and accumulating the collected light information without entering saturation and without a non-linear response.

By accumulating the successive values and maintaining operation within linear range below pixel and/or charge amplifier capacity 1118, an embodiment of the invention may advantageously avoid undesirable non-linearity effects and increase effective dynamic range. Thus, the inventive embodiments may accomplish two goals simultaneously: accumulating more signal and maintaining linear response.

A conventional sensor system may be limited by the pixel and/or charge amplifier capacity 1118 ($S_{max}$). However, according to an embodiment of the invention, an extended dynamic range level of 1120 may be achieved. Thus, embodiments of the invention may simultaneously relax $S_{max}$ limitation on both sensor/pixel and AFE, in this invention. Since integration happens at both the pixel and the AFE, either of which could be a bottleneck/$S_{max}$ limiting factor in a conventional design. However, in an embodiment of the invention, the timing is designed such that charge/current flows into AFE before saturation could happen at the pixels, and at the AFE, the inventive control schemes implement "more" reads, thereby advantageously avoiding saturation at both the pixel and AFE.

Figure 12:
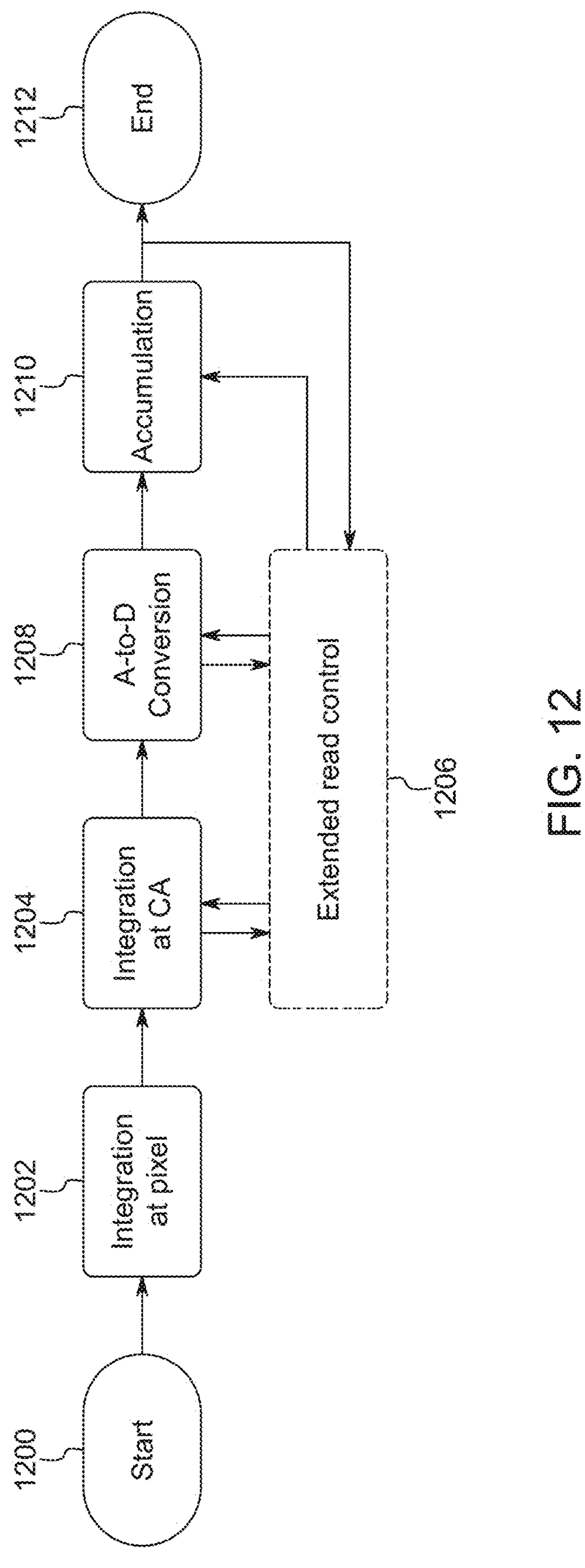
FIG. 12 is a flow diagram of method according to an embodiment of the invention.

FIG. 12 illustrates a method of performing extended read according to another embodiment of the invention. At start 1200, as determined by a controlling host, the extended read starts. At step 1202, integration is performed at a pixel. At step 1204, integration is performed at a charge amplifier. At the pixel level, integration is a passive process-charges generated by the photo diode must accumulate locally (at the capacitor) before some switch is closed, allowing the charge to be transferred to AFE. At the AFE, the integration is an active process in that a dedicated charge amplifier moves the incoming charges and deposit them onto the integration cap. At step 1208, the analog charge amplifier voltage value is converted to a digital value and in step 1210, the digital value is stored or accumulated in the accumulator. In step 1206, the extended read control operation monitors the voltage output by the charge amplifier (according to a first embodiment) or monitors the digital value stored in the accumulator (according to a second embodiment) to determine when to reset/recondition the charge amplifier and store/accumulate the latest digital value. Steps 1204, 1206, 1208, and 1210 repeat until the extended read cycle is ended.

The invention includes different possible scenarios for ending the extended read cycle. In one of the scenarios, the system (host) defines an OE time at the end of which the read must complete. In another scenario, the system (host) can define a read level (accumulator content size) as a maximum number, and EDR ends when approaching/crossing this level. Selection of the extended read cycle end condition may therefore be determined by system level requirements.

FIG. 12 shows a method of performing an extended dynamic range read according to an embodiment of the invention. The extended dynamic range read begins at step 1200, followed by integration at the pixel in step 1202 followed by integration at the charge amplifier (CA) in step 1204. In step 1208, an A-to-D converter converts the result of charge amplifier integration into a digital value. The extended read control step 1206 may monitor an output voltage of the integration at the charge amplifier in step 1204 and/or a digital converted output of the A-to-D conversion in step 1208. An accumulation step 1210 temporarily stores and adds successive outputs of the A-to-D conversion step 1208, under control of the extended read control 1206, until the extended read is completed and the process stops at step 1212.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Methods and systems described herein may be implemented using computer programming or engineering techniques including computer software, firmware, hardware or any combination or subset thereof, wherein the technical effects may include at least processing of data according to the present disclosure.

Figure 13:
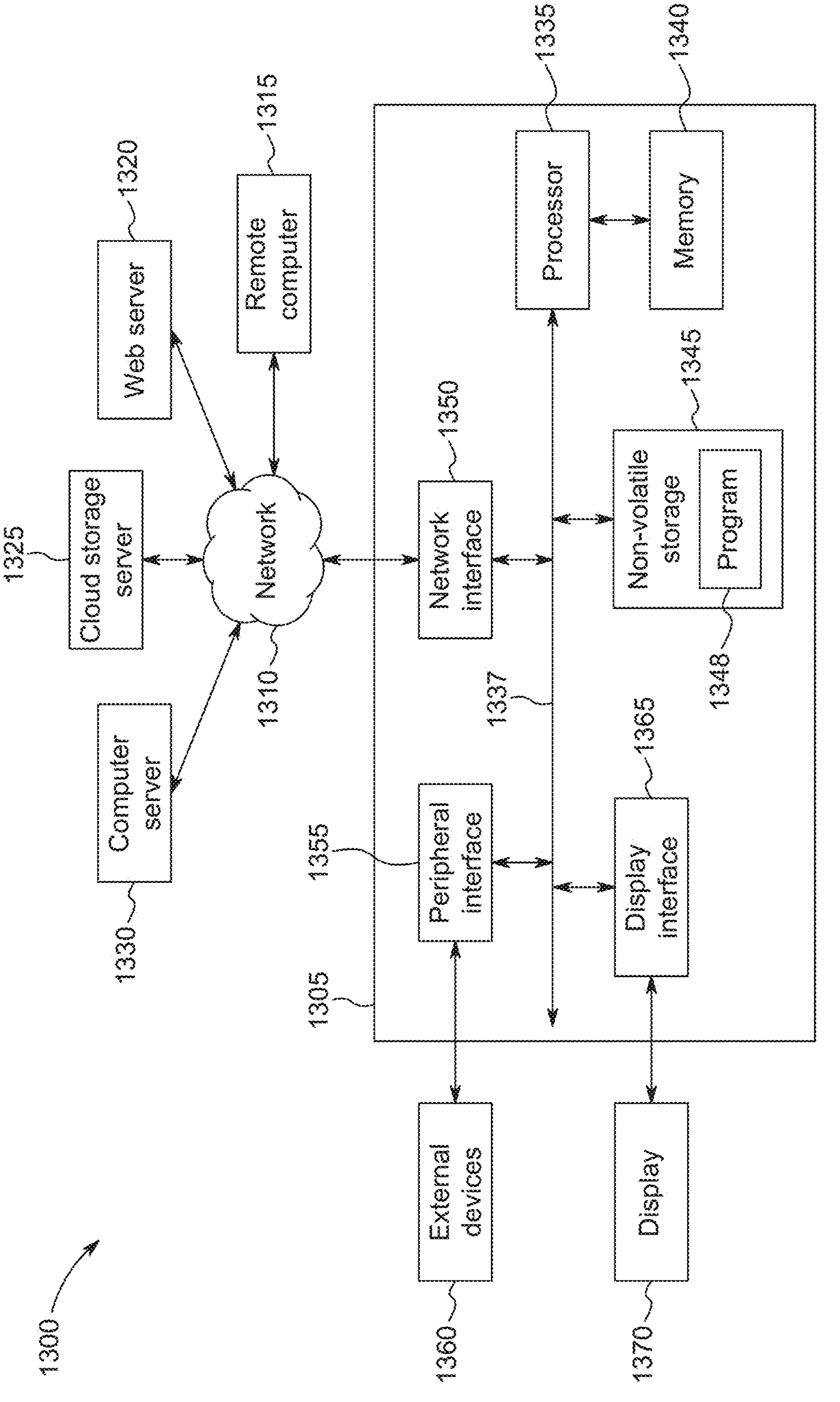
FIG. 13 is a block diagram of a computer or related circuitry according to an embodiment of the invention.

FIG. 13 illustrates a block diagram of a computer or related circuitry that may implement at least portions of the various embodiments described herein, such as the host 104. Control aspects of the present disclosure may be embodied as a system, a method, and/or a computer program product. The computer program product may include a computer readable storage medium on which computer readable program instructions are recorded that may cause one or more processors to carry out aspects of the embodiment.

The computer readable storage medium may be a tangible and non-transitory device that can store instructions for use by an instruction execution device (processor). The computer readable storage medium may be, for example, but is not limited to, an electronic storage device, a magnetic storage device, an optical storage device, an electromagnetic storage device, a semiconductor storage device, or any appropriate combination of these devices. A non-exhaustive list of more specific examples of the computer readable storage medium includes each of the following (and appropriate combinations): flexible disk, hard disk, solid-state drive (SSD), random access memory (RAM), read-only memory (ROM), erasable programmable read-only memory (EPROM or Flash), static random access memory (SRAM), compact disc (CD or CD-ROM), digital versatile disk (DVD), MO, and memory card or stick. A computer readable storage medium, as used in this disclosure, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions implementing the functions described in this disclosure can be downloaded to an appropriate computing or processing device from a computer readable storage medium or to an external computer or external storage device via a global network (i.e., the Internet), a local area network, a wide area network and/or a wireless network. The network may include copper transmission wires, optical communication fibers, wireless transmission, routers, firewalls, switches, gateway computers and/or edge servers. A network adapter card or network interface in each computing or processing device may receive computer readable program instructions from the network and forward the computer readable program instructions for storage in a computer readable storage medium within the computing or processing device.

Computer readable program instructions for carrying out operations of the present disclosure may include machine language instructions and/or microcode, which may be compiled or interpreted from source code written in any combination of one or more programming languages, including assembly language, Basic, Fortran, Java, Python, R, C, C++, C# or similar programming languages. The computer readable program instructions may execute entirely on a user's personal computer, notebook computer, tablet, or smartphone, entirely on a remote computer or computer server, or any combination of these computing devices. The remote computer or computer server may be connected to the user's device or devices through a computer network, including a local area network or a wide area network, or a global network (i.e., the Internet). In some embodiments, electronic circuitry including, for example, programmable logic circuitry, field-programmable gate arrays (FPGA), or programmable logic arrays (PLA) may execute the computer readable program instructions by using information from the computer readable program instructions to configure or customize the electronic circuitry, in order to perform aspects of the present disclosure.

Aspects of the present disclosure are described herein with reference to flow diagrams and block diagrams of methods, apparatus (systems), and computer program products according to embodiments of the disclosure. It will be understood by those skilled in the art that each block of the flow diagrams and block diagrams, and combinations of blocks in the flow diagrams and block diagrams, can be implemented by computer readable program instructions.

The computer readable program instructions that may implement the systems and methods described in this disclosure may be provided to one or more processors (and/or one or more cores within a processor) of a general purpose computer, special purpose computer, or other programmable apparatus to produce a machine, such that the instructions, which execute via the processor of the computer or other programmable apparatus, create a system for implementing the functions specified in the flow diagrams and block diagrams in the present disclosure. These computer readable program instructions may also be stored in a computer readable storage medium that can direct a computer, a programmable apparatus, and/or other devices to function in a particular manner, such that the computer readable storage medium having stored instructions is an article of manufacture including instructions which implement aspects of the functions specified in the flow diagrams and block diagrams in the present disclosure.

The computer readable program instructions may also be loaded onto a computer, other programmable apparatus, or other device to cause a series of operational steps to be performed on the computer, other programmable apparatus or other device to produce a computer implemented process, such that the instructions which execute on the computer, other programmable apparatus, or other device implement the functions specified in the flow diagrams and block diagrams in the present disclosure.

FIG. 13 is a functional block diagram illustrating a networked system 1300 of one or more networked computers and servers. In an embodiment, the hardware and software environment illustrated in FIG. 13 may provide an exemplary platform for implementation of the software and/or methods according to the present disclosure. Referring to FIG. 13, a networked system 1300 may include, but is not limited to, computer 1305, network 1310, remote computer 1315, web server 1320, cloud storage server 1325 and computer server 1330. In some embodiments, multiple instances of one or more of the functional blocks illustrated in FIG. 13 may be employed.

Additional detail of a computer 1305 is also shown in FIG. 13. The functional blocks illustrated within computer 1305 are provided only to establish exemplary functionality and are not intended to be exhaustive. And while details are not provided for remote computer 1315, web server 1320, cloud storage server 1325 and computer server 1330, these other computers and devices may include similar functionality to that shown for computer 1305. Computer 1305 may be a personal computer (PC), a desktop computer, laptop computer, tablet computer, netbook computer, a personal digital assistant (PDA), a smart phone, or any other programmable electronic device capable of communicating with other devices on network 1310.

Computer 1305 may include processor 1335, bus 1337, memory 1340, non-volatile storage 1345, network interface 1350, peripheral interface 1355 and display interface 1365. Each of these functions may be implemented, in some embodiments, as individual electronic subsystems (integrated circuit chip or combination of chips and associated devices), or, in other embodiments, some combination of functions may be implemented on a single chip (sometimes called a system on chip or SoC).

Processor 1335 may be one or more single or multi-chip microprocessors, such as those designed and/or manufactured by Intel Corporation, Advanced Micro Devices, Inc. (AMD), Arm Holdings (Arm), Apple Computer, etc. Examples of microprocessors include Celeron, Pentium, Core i3, Core i5 and Core i7 from Intel Corporation; Opteron, Phenom, Athlon, Turion and Ryzen from AMD; and Cortex-A, Cortex-R and Cortex-M from Arm. Bus 1337 may be a proprietary or industry standard high-speed parallel or serial peripheral interconnect bus, such as ISA, PCI, PCI Express (PCI-e), AGP, and the like.

Memory 1340 and non-volatile storage 1345 may be computer-readable storage media. Memory 1340 may include any suitable volatile storage devices such as Dynamic Random-Access Memory (DRAM) and Static Random-Access Memory (SRAM). Non-volatile storage 1345 may include one or more of the following: flexible disk, hard disk, solid-state drive (SSD), read-only memory (ROM), erasable programmable read-only memory (EPROM or Flash), compact disc (CD or CD-ROM), digital versatile disk (DVD) and memory card or stick.

Program 1348 may be a collection of machine-readable instructions and/or data that is stored in non-volatile storage 1345 and is used to create, manage and control certain software functions that are discussed in detail elsewhere in the present disclosure and illustrated in the drawings. In some embodiments, memory 1340 may be considerably faster than non-volatile storage 1345. In such embodiments, program 1348 may be transferred from non-volatile storage 1345 to memory 1340 prior to execution by processor 1335.

Computer 1305 may be capable of communicating and interacting with other computers via network 1310 through network interface 1350. Network 1310 may be, for example, a local area network (LAN), a wide area network (WAN) such as the Internet, or a combination of the two, and may include wired, wireless, or fiber optic connections. In general, network 1310 can be any combination of connections and protocols that support communications between two or more computers and related devices.

Peripheral interface 1355 may allow for input and output of data with other devices that may be connected locally with computer 1305. For example, peripheral interface 1355 may provide a connection to external devices 1360. External devices 1360 may include devices such as a keyboard, a mouse, a keypad, a touch screen, and/or other suitable input devices. External devices 1360 may also include portable computer-readable storage media such as, for example, thumb drives, portable optical or magnetic disks, and memory cards. Software and data used to practice embodiments of the present disclosure, for example, program 1348, may be stored on such portable computer-readable storage media. In such embodiments, software may be loaded onto non-volatile storage 1345 or, alternatively, directly into memory 1340 via peripheral interface 1355. Peripheral interface 1355 may use an industry standard connection, such as RS-232 or Universal Serial Bus (USB), to connect with external devices 1360.

Display interface 1365 may connect computer 1305 to display 1370. Display 1370 may be used, in some embodiments, to present a command line or graphical user interface to a user of computer 1305. Display interface 1365 may connect to display 1370 using one or more proprietary or industry standard connections, such as VGA, DVI, DisplayPort and HDMI.

As described above, network interface 1350, provides for communications with other computing and storage systems or devices external to computer 1305. Software programs and data discussed herein may be downloaded from, for example, remote computer 1315, web server 1320, cloud storage server 1325 and computer server 1330 to non-volatile storage 1345 through network interface 1350 and network 1310. Furthermore, the systems and methods described in this disclosure may be executed by one or more computers connected to computer 1305 through network interface 1350 and network 1310. For example, in some embodiments the systems and methods described in this disclosure may be executed by remote computer 1315, computer server 1330, or a combination of the interconnected computers on network 1310.

Data, datasets and/or databases employed in embodiments of the systems and methods described in this disclosure may be stored and or downloaded from remote computer 1315, web server 1320, cloud storage server 1325 and computer server 1330.

Numerous modifications and variations of the present invention are possible in light of the above teachings. It is therefore to be understood that within the scope of the appended claims, the invention may be practiced otherwise than as specifically described herein.

What is claimed is:

1. An optical sensor system comprising:

a thin-film transistor (TFT) optical panel including an array of TFT pixels;

a charge amplifier configured to temporarily store a charge received from a TFT pixel in the array of TFT pixels and generate a voltage based on the temporarily stored charge;

an analog-to-digital converter to generate a digitized value based on the voltage;

an accumulator configured to store the digitized value; and a controller circuit configured to cause the temporarily stored charge in the charge amplifier to be reset based on one of the voltage and the digitized value, wherein the charge amplifier includes an operational amplifier, and a reset transistor having a first controlled terminal connected to an inverting input of the operational amplifier, a second controlled terminal connected to an output of the operational amplifier, and a reset control terminal that controls current flow in the first controlled terminal and the second controlled terminal; and the controller circuit is configured to send a reset signal pulse to the reset control terminal to cause the temporarily stored charge in the charge amplifier to be reset.

2. The optical sensor system according to claim 1, wherein each TFT pixel includes only one TFT.

3. The optical sensor system according to claim 1, wherein the controller circuit includes:

a first controller circuit and a second controller circuit, the second controller circuit including a comparator that compares an output of the charge amplifier to a predetermined threshold value, a D-flip flop having a clock input connected to an output of the comparator, and a D-input connected to a logic 1 value, an exclusive-OR gate having a first input connected to a non-inverting output of the D-flip flop, and a programmable delay circuit having an input connected to the non-inverting output of the D-flip flop, a second input of the exclusive-OR gate is connected to an output of the programmable delay circuit, and an output of the exclusive-OR gate is configured to output an extended read reset signal pulse to the first controller circuit; and the first controller circuit is configured to send a reset signal to the charge amplifier based on the extended read reset signal pulse to cause the temporarily stored charge in the charge amplifier to be reset.

4. The optical sensor system according to claim 1, wherein the controller circuit includes:

a first controller circuit and a second controller circuit, the second controller circuit including a programmed processor configured to determine when an output of the charge amplifier exceeds a predetermined threshold value and, after a predetermined delay time, output an extended read reset signal pulse to the first controller circuit; and the first controller circuit is configured to send a reset signal to the charge amplifier based on the extended read reset signal pulse to cause the temporarily stored charge in the charge amplifier to be reset.

5. The optical sensor system according to claim 1, further comprising:

a host apparatus including a host processer circuit configured to operate according to a host application that uses information obtained from the array of TFT pixels, wherein the accumulator includes:

an n+m bit adder circuit having an n bit input and an n+m bit input and configured to add a value of the n bit input to a value of the n+m bit input, the n-bit input being connected to an output of the analog-to-digital converter; and an n+m bit register circuit having a D input connected to an output of the n+m bit adder circuit, and a non-inverting output connected to the n+m bit input of the n+m bit adder circuit, an output of the n+m bit register circuit being provided to the host application.

6. The optical sensor system according to claim 1, wherein a read cycle corresponds to a time during which the charge is received from a same TFT pixel in the array of TFT pixels, each read cycle includes a plurality of sub-read cycles, and the temporarily stored charge in the charge amplifier is reset at an end of each sub-read cycle, and the accumulator is configured to accumulate a digitized value of each temporarily stored charge prior to the reset at the end of each sub-read cycle so that at an end of the read cycle, the accumulator stores a digitized value that is a sum of digitized values of each of the temporarily stored charges in each sub-read cycle of the read cycle.

7. A method of operating an optical sensor system, the method comprising:

receiving light on a thin-film transistor (TFT) optical panel including an array of TFT pixels;

temporarily storing, in a charge amplifier, a charge received from a TFT pixel in the array of TFT pixels;

generating a voltage based on the temporarily stored charge;

generating, in an analog-to-digital converter, a digitized value based on the voltage;

storing the digitized value in an accumulator;

causing, by a controller circuit, the temporarily stored charge in the charge amplifier to be reset based on one of the voltage and the digitized value; and sending, from the controller circuit, a reset signal to cause the temporarily stored charge in the charge amplifier to be reset, when the voltage exceeds a predetermined threshold.

8. The method of claim 7, further comprising:

accumulating, in the accumulator, a sum of the digitized value and a previously accumulated digitized value, each time the voltage exceeds a predetermined threshold.

9. The method of claim 7, further comprising:

accumulating, in the accumulator, a sum of the digitized value and a previously accumulated digitized value, each time the digitized value exceeds a predetermined threshold.

10. The method of claim 7, wherein a read cycle corresponds to a time during which the charge is received from a same TFT pixel in the array of TFT pixels, each read cycle includes a plurality of sub-read cycles, and the temporarily stored charge in the charge amplifier is reset at an end of each sub-read cycle, and the accumulator is configured to accumulate a digitized value of each temporarily stored charge prior to the reset at the end of each sub-read cycle so that at an end of the read cycle, the accumulator stores a digitized value that is a sum of digitized values of each of the temporarily stored charges in each sub-read cycle of the read cycle.

11. A non-transitory computer readable medium storing instructions, which when executed by a computer in an optical sensor system including a thin-film transistor (TFT) optical panel including an array of TFT pixels, a charge amplifier configured to temporarily store a charge received from a TFT pixel in the array of TFT pixels and generate a voltage based on the temporarily stored charge, and an analog-to-digital converter to generate a digitized value based on the voltage, cause the computer to perform steps comprising:

storing the digitized value in an accumulator; and causing the temporarily stored charge in the charge amplifier to be reset based on one of the voltage and the digitized value, wherein the computer is further cause to perform steps further comprising:

sending a reset signal to cause the temporarily stored charge in the charge amplifier to be reset when the digitized value based on the voltage exceeds a predetermined threshold.

12. The computer readable medium of claim 11, wherein the computer is further cause to perform steps further comprising:

causing the accumulator to accumulate a sum of the digitized value and a previously accumulated digitized value, each time the voltage exceeds a predetermined threshold.

13. The computer readable medium of claim 11, wherein the computer is further cause to perform steps further comprising:

causing the accumulator to accumulate a sum of the digitized value and a previously accumulated digitized value, each time the digitized value exceeds a predetermined threshold.

14. The computer readable medium of claim 13, wherein a read cycle corresponds to a time during which the charge is received from a same TFT pixel in the array of TFT pixels, each read cycle includes a plurality of sub-read cycles, and the temporarily stored charge in the charge amplifier is reset at an end of each sub-read cycle, and the accumulator is configured to accumulate the digitized value of each temporarily stored charge prior to the reset at the end of each sub-read cycle so that at an end of the read cycle, the accumulator stores a digitized value that is a sum of the digitized values of each of the temporarily stored charges in each sub-read cycle of the read cycle.

* * * * *